United States Patent
Lee et al.

(10) Patent No.: US 12,557,287 B2
(45) Date of Patent: Feb. 17, 2026

(54) SEMICONDUCTOR DEVICE AND MANUFACTURING METHOD OF SEMICONDUCTOR DEVICE

(71) Applicant: SK hynix Inc., Icheon-si (KR)

(72) Inventors: Dong Uk Lee, Icheon-si (KR); Hae Chang Yang, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 433 days.

(21) Appl. No.: 18/108,501

(22) Filed: Feb. 10, 2023

(65) Prior Publication Data

US 2024/0074188 A1    Feb. 29, 2024

(30) Foreign Application Priority Data

Aug. 26, 2022 (KR) .................. 10-2022-0107657

(51) Int. Cl.
| | |
|---|---|
| H10B 43/30 | (2023.01) |
| H10B 41/27 | (2023.01) |
| H10B 41/35 | (2023.01) |
| H10B 43/27 | (2023.01) |
| H10B 43/35 | (2023.01) |

(52) U.S. Cl.
CPC ............. *H10B 43/27* (2023.02); *H10B 41/27* (2023.02); *H10B 41/35* (2023.02); *H10B 43/35* (2023.02)

(58) Field of Classification Search
CPC .................................................. H10B 43/10
See application file for complete search history.

(56) References Cited

U.S. PATENT DOCUMENTS

| | | | |
|---|---|---|---|
| 9,425,324 B2 | 8/2016 | Diaz et al. | |
| 2016/0093745 A1* | 3/2016 | Diaz | H10D 62/235 |
| | | | 257/29 |
| 2022/0254803 A1* | 8/2022 | Shen | H10B 43/10 |
| 2022/0358985 A1* | 11/2022 | Wang | G11C 11/2259 |

FOREIGN PATENT DOCUMENTS

| | | |
|---|---|---|
| KR | 1020190026139 A | 3/2019 |
| KR | 20220082619 A | 6/2022 |

OTHER PUBLICATIONS

Frank Schindler, et al., Higher-order topological insulators, Science Advances Research Article, Sci. Adv., 4 (6), eaat0346. • DOI: 10.1126/sciadv.aat0346, Jun. 1, 2018, pp. 1-7, American Association for the Advancement of Science (AAAS), Washington, DC, U.S.

(Continued)

*Primary Examiner* — Christopher A Johnson
(74) *Attorney, Agent, or Firm* — WILLIAM PARK AND ASSOCIATES LTD.

(57) ABSTRACT

A semiconductor device may include a source line, a bit line, and a gate structure located between the source line and the bit line. The gate structure may include conductive layers and insulating layers that are alternately stacked. The semiconductor device may include a topological insulator that may extend from the bit line to the source line through the gate structure. The topological insulator may include a non-conductor region and semiconductor regions coupled to the non-conductor region and located at a sidewall of the topological insulator. The semiconductor device may also include a memory layer surrounding the topological insulator.

20 Claims, 11 Drawing Sheets

(56) References Cited

OTHER PUBLICATIONS

Radha Krishna Gopal, et al., Topological delocalization and tuning of surface channel separation in Bi Se Te Topological Insulator Thin films, Scientific Reports 7, Article No. 4924 (2017), Jul. 7, 2017, https://doi.org/10.1038/s41598-017-04458-2.

Sven Just, et al., Parasitic conduction channels in topological insulator thin films, Phys. Rev. B 101, 245413—Published Jun. 11, 2020, Germany.

Zhuo Bin Siu, et al., Quantum Capacitance of a Topological Insulator-Ferromagnet Interface, Scientific Reports 7, Article No. 45016 (2017), Mar. 24, 2017, https://doi.org/10.1038/srep45016.

* cited by examiner

SEMICONDUCTOR DEVICE AND MANUFACTURING METHOD OF SEMICONDUCTOR DEVICE

CROSS-REFERENCE TO RELATED APPLICATION

This application claims priority under 35 U.S.C. § 119(a) to Korean Patent Application No. 10-2022-0107657 filed on Aug. 26, 2022, in the Korean Intellectual Property Office, which is incorporated herein by reference in its entirety.

BACKGROUND

1. Technical Field

Embodiments of the present disclosure relate to an electronic device, and more particularly, to a semiconductor device and a manufacturing method of the semiconductor device.

2. Related Art

The degree of integration of a semiconductor device is mainly determined by an area occupied by a unit memory cell. Recently, as the improvement in the degree of integration of a semiconductor device for forming memory cells in a single layer on a substrate reaches a limit, a three-dimensional semiconductor device for stacking memory cells on a substrate has been proposed. Furthermore, in order to improve the operational reliability of such a semiconductor device, various structures and manufacturing methods have been developed.

SUMMARY

In an embodiment, a semiconductor device may include a source line, a bit line, and a gate structure located between the source line and the bit line. The gate structure may include conductive layers and insulating layers that are alternately stacked. The semiconductor device may include a topological insulator that may extend from the bit line to the source line through the gate structure. The topological insulator may include a non-conductor region and one or more semiconductor regions coupled to the non-conductor region and located at a sidewall of the topological insulator. The semiconductor device may also include a memory layer surrounding the topological insulator.

In an embodiment, a semiconductor device may include a bit line, a source line, and a memory string connected between the bit line and the source line. The memory string may include at least one source select transistor, a plurality of memory cells, and at least one drain select transistor. Each of the memory cells may include a first channel layer that includes a topological insulator including first protruding edges, where the topological insulator may include semiconductor regions located at the first protruding edges. The memory cell may include a tunneling layer surrounding the first channel layer, a data storage layer surrounding the tunneling layer, and a blocking layer surrounding the data storage layer.

In an embodiment, a manufacturing method of a semiconductor device may include forming a stack including first material layers and second material layers that are alternately stacked. A first opening may be formed in the stack, where the first opening may include at least one first protruding edge in the stack. A memory layer may be formed in the first opening, where the memory layer may include at least one second protruding edge. A first channel layer may be formed on the memory layer, where the memory layer may include a topological insulator including at least one third protruding edge.

DETAILED DESCRIPTION

Various embodiments are directed to a semiconductor device having a stable structure and improved characteristics and a manufacturing method thereof.

By stacking memory cells in three dimensions, it is possible to improve the degree of integration of a semiconductor device. Furthermore, it is possible to provide a semiconductor device having a stable structure and improved reliability.

Hereafter, embodiments in accordance with the technical spirit of the present disclosure will be described with reference to the accompanying drawings.

Figure 1A:
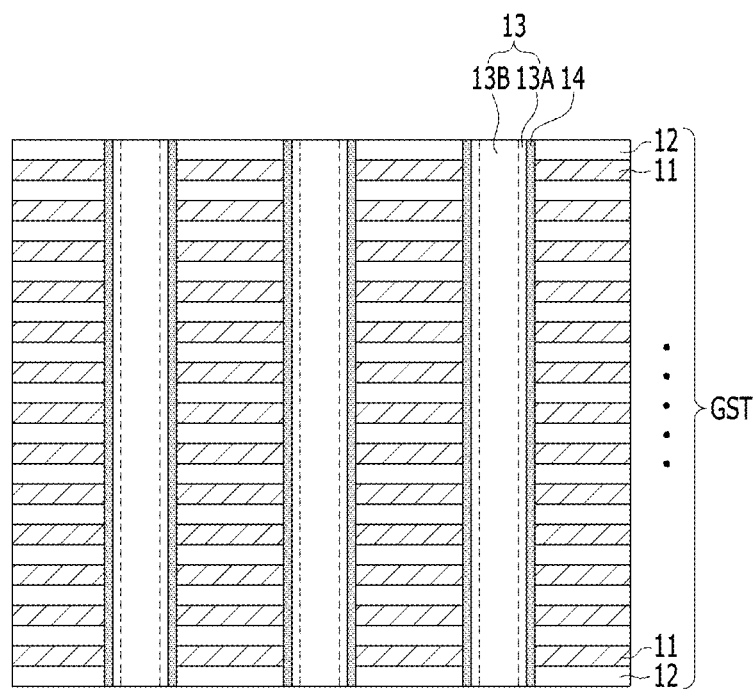
FIG. 1A and FIG. 1B are diagrams illustrating the structure of an example semiconductor device in accordance with an embodiment.
Figure 1B:
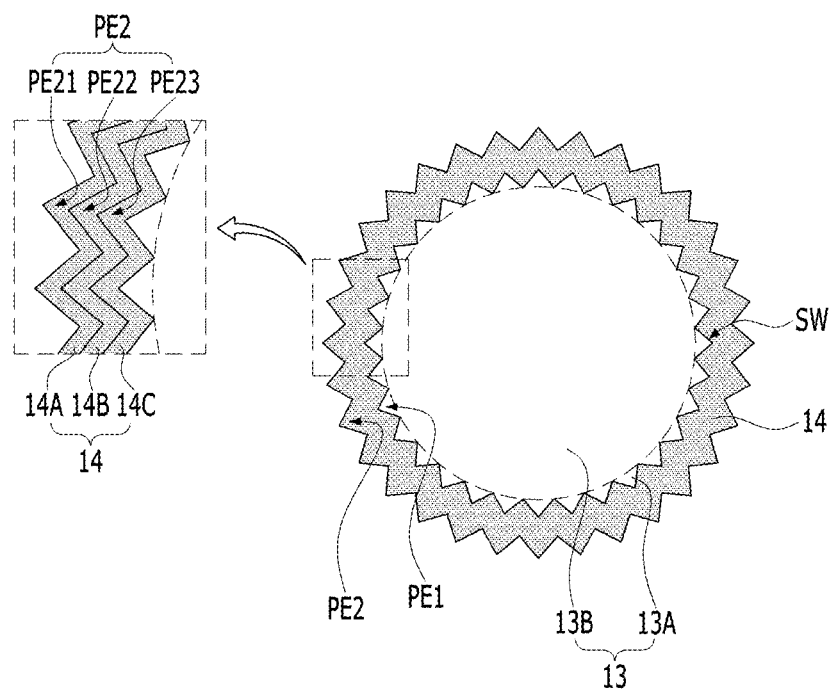

FIG. 1A and FIG. 1B are diagrams illustrating the structure of an example semiconductor device in accordance with an embodiment.

Referring to FIG. 1A and FIG. 1B, the semiconductor device may include a gate structure GST, a channel layer 13, or a memory layer 14, or a combination thereof. The gate structure GST may include conductive layers 11 and insulating layers 12 that are alternately stacked. A conductive layer 11 may be a gate line such as a word line, a bit line, or a select line. The conductive layers 11 may each include a conductive material such as, for example, polysilicon, molybdenum, tungsten, etc. The insulating layers 12 are used to insulate the conductive layers 11 from each other, and may each include an insulating material such as, for example, oxide, nitride, an air gap, etc.

One or more channel layer 13 may be located in the gate structure GST, and the channel layers 13 may be spaced along a first direction I and/or a second direction II intersecting the first direction I. In the gate structure GST, the channel layers 13 may extend in a third direction III that may be a direction protruding from a plane defined by the first direction I and the second direction II. Therefore, the channel layers 13 may be spaced on the plane defined by the first direction I and the second direction II. A stacking direction of the conductive layers 11 may be the third direction III that is perpendicular to the plane defined by the first direction I and the second direction II.

In an embodiment, the channel layer 13 may pass through the gate structure GST in the third direction III. Transistors may be located in regions where the channel layer 13 and the conductive layers 11 intersect each other. When the conductive layer 11 is a select line, a select transistor may be located in the intersection region. When the conductive layer 11 is a word line or a bit line, a memory cell may be located in the intersection region. The select transistor and the memory cell stacked in the third direction III may share the channel layer 13.

The channel layer 13 may include a topological insulator, and in some embodiments, the topological insulator may be used as the channel layer 13. Accordingly, the topological insulator may extend in the third direction III in the gate structure GST. The topological insulator may include, for example, a topological crystalline insulator, a high order topological insulator, etc. An n-type or a p-type carrier may be generated by a vacancy or a defect such as, for example, bismuth (Bi), tellurium (Te), selenium (Se), etc. in the topological insulator. In an embodiment, the channel layer 13 may include, for example, one or more of $Bi_2Se_3$, $Bi_2Te_3$, $Sb_2Te_3$, SnTe, $Bi_2Se_2Te$, $Bi_2Te_2$, $Bi_{2-x}Sb_xTe_3$, $Bi_xSb_{1-x}Te_ySe_{1-y}$, etc. The channel layer 13 may include a two-dimensional material such as, for example, a two-dimensional atomic layer.

The topological insulator may have a surface with properties of a conductor or a semiconductor by a topological wave function, and may have an interior portion with properties of a non-conductor. In an embodiment, the non-conductor region may be said to be surrounded by the semiconductor region. Other embodiments may have the non-conductor region in the semiconductor region. In an embodiment, in the case of a ternary topological insulator, the topological insulator may have a one-dimensional hinge where two two-dimensional surfaces meet each other. Because the mirror symmetry of an energy band is maintained at the hinge, the topological insulator may have semiconductor or conductor properties. Because the mirror symmetry of the energy band is broken on a curved surface, the ternary topological insulator may have properties of a non-conductor. Accordingly, the channel layer 13 in accordance with an embodiment may include the topological insulator as a channel material of a transistor, and a current path of the transistor may be controlled through the shape of the topological insulator.

As an example, the topological insulator may include a semiconductor region on a sidewall SW and a non-conductor region surrounded by, or located within, the semiconductor region. The topological insulator may include at least one first protruding edge PE1 on the sidewall SW. The first protruding edge PE1 may have a shape where the mirror symmetry of the topological insulator is maintained. In an embodiment, the first protruding edge PE1 may have a polygonal shape in plan view as shown in FIG. 1B. The topological insulator may include a plurality of first protruding edges PE1 that may have a sawtooth shape in plan view. Accordingly, the topological insulator may include semiconductor regions 13A comprising areas at the first protruding edges PE1, and the semiconductor regions 13A may be used as a channel region of a transistor. During an operation of the transistor, current may flow through the semiconductor regions 13A.

Since a region of the channel layer 13, excluding the semiconductor regions 13A defined by the first protruding edges PE1, has no mirror symmetry, that region of the topological insulator may have non-conductor properties. The non-conductive region may be referred to as a non-conductor region 13B. In an embodiment, the topological insulator may include the non-conductor region 13B and the semiconductor regions 13A coupled to the non-conductor region 13B. In an embodiment, the semiconductor regions 13A may be located in the first protruding edges PE1, respectively, and the non-conductor region 13B may be located at a core of the channel layer 13 surrounded by the semiconductor regions 13A. The semiconductor regions 13A may be isolated from each other by the non-conductor region 13B. Accordingly, a separate insulating core may not be formed, and current flow may be concentrated on the surface of the channel layer 13.

For reference, the channel layer 13 may include an organic material or an inorganic material having mirror symmetry instead of the topological insulator.

The memory layer 14 may be located between the channel layer 13 and the conductive layers 11. In an embodiment, the memory layer 14 may be formed to surround the channel layer 13. The memory layer 14 may include at least one of a blocking layer 14A, a data storage layer 14B, or a tunneling layer 14C, or a combination thereof. The tunneling layer 14C may surround the channel layer 13, and include an insulating material. The data storage layer 14B may surround the tunneling layer 14C, and include a floating gate, polysilicon, a charge trap material, nitride, a variable resistance material, a nanostructure, or a combination thereof. The blocking layer 14A may surround the data storage layer 14B and include a high-k material.

The memory layer 14 may surround the sidewall SW of the channel layer 13. The memory layer 14 may include, for example, at least one second protruding edge PE21 on the outer sidewall of the blocking layer 14A, at least one second protruding edge PE22 on the outer sidewall of the data storage layer 14B, and/or at least one second protruding edge PE23 on the outer sidewall of the tunneling layer 14C. The second protruding edges PE21, PE22, and/or PE23 may have shapes corresponding to the first protruding edge PE1. Accordingly, the second protruding edges PE2, which includes the second protruding edges PE21, PE22, and PE23, may have a polygonal shape in plan view. In an embodiment, the second protruding edge PE22 may be transferred from the blocking layer 14A, and the second protruding edge PE23 may be transferred from the data storage layer 14B. Accordingly, the term "transfer" may refer to patterning a subsequent layer (e.g., the data storage layer 14B) based on a present layer (e.g., the blocking layer 14A). In some embodiments, at least some portions of the subsequent layer may be scaled down compared to the present layer as the subsequent layer has a smaller diameter than the present layer.

According to the structure described above, a transistor using the topological insulator as the channel layer 13 may be implemented, and a current flow may be concentrated on the first protruding edges PE1. Accordingly, recombination of carriers and an increase in resistance due to the recombination may be minimized or suppressed compared to a case where a polysilicon layer having a trap site at a grain boundary is used as a channel layer. Operating characteristics of a transistor such as leakage current and gate control may be improved, and threshold voltage distribution of memory cells may be improved.

Figure 2A:
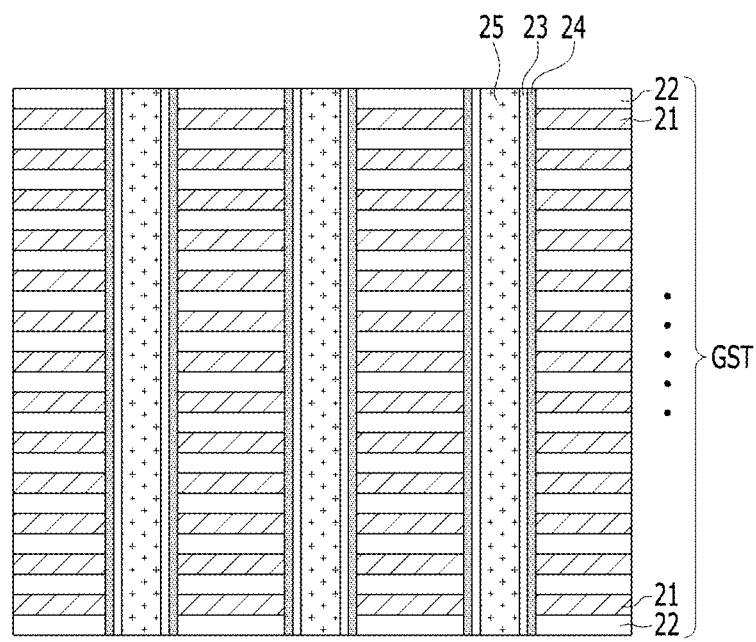
FIG. 2A and FIG. 2B are diagrams illustrating the structure of an example semiconductor device in accordance with an embodiment.
Figure 2B:
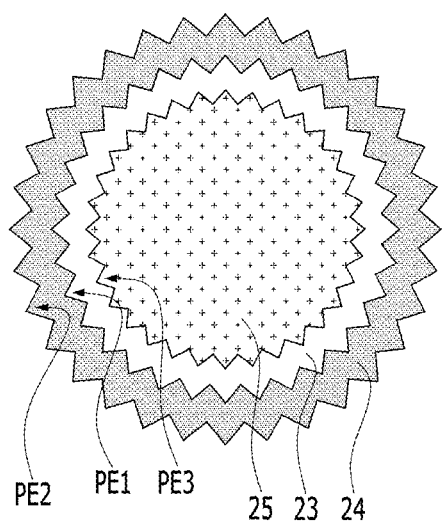

FIG. 2A and FIG. 2B are diagrams illustrating the structure of an example semiconductor device in accordance with an embodiment. Previously described content may not be repeated.

Referring to FIG. 2A and FIG. 2B, the semiconductor device may include a gate structure GST, one or both of a channel layer 23 and a memory layer 24, and an insulating core 25. The gate structure GST may include conductive layers 21 and insulating layers 22 that are alternately stacked. A conductive layer 21 may be a gate line such as a word line, a bit line, or a select line. The channel layer 23 may be located in the gate structure GST and may extend in the third direction III.

The channel layer 23 may include a topological insulator. The channel layer 23 may include at least one first protruding edge PE1 on its outer sidewall. The first protruding edge PE1 may have a shape in which the mirror symmetry of the topological insulator is maintained. The channel layer 23 may include at least one semiconductor region and a non-conductor region. The semiconductor region may be located, for example, in the first protruding edge PE1 and may be used as a channel region of a transistor.

The memory layer 24 may be located between the channel layer 23 and the conductive layers 21. The memory layer 24 may include at least one of a blocking layer, a data storage layer, or a tunneling layer, or a combination thereof. The memory layer 24 may include at least one second protruding edge PE2 on the outer sidewall and/or the inner sidewall thereof. The second protruding edge PE2 may be located corresponding to the first protruding edge PE1, and may have a shape corresponding to the first protruding edge PE1.

The insulating core 25 may be located in the channel layer 23. In an embodiment, the channel layer 23 may have a tube shape, and the insulating core 25 may fill the inside of the channel layer 23. The non-conductor region of the channel layer 23 may be in contact with the insulating core 25. The insulating core 25 may include an insulating material such as, for example, oxide, nitride, air gap, etc. The insulating core 25 may include at least one third protruding edge PE3 on its outer sidewall. The third protruding edge PE3 may be located corresponding to the first protruding edge PE1 and/or the second protruding edge PE2, and may have a shape corresponding to the first protruding edge PE1 and/or the second protruding edge PE2.

According to the structure described above, the insulating core 25 may be formed as a separate layer in the channel layer 23. Accordingly, compared to a case where the channel layer is formed using the polysilicon layer, the thickness of the channel layer 23 may be reduced, and gate control characteristics and operation characteristics of a transistor may be improved. Furthermore, the threshold voltage distribution of memory cells may be improved.

Figure 3A:
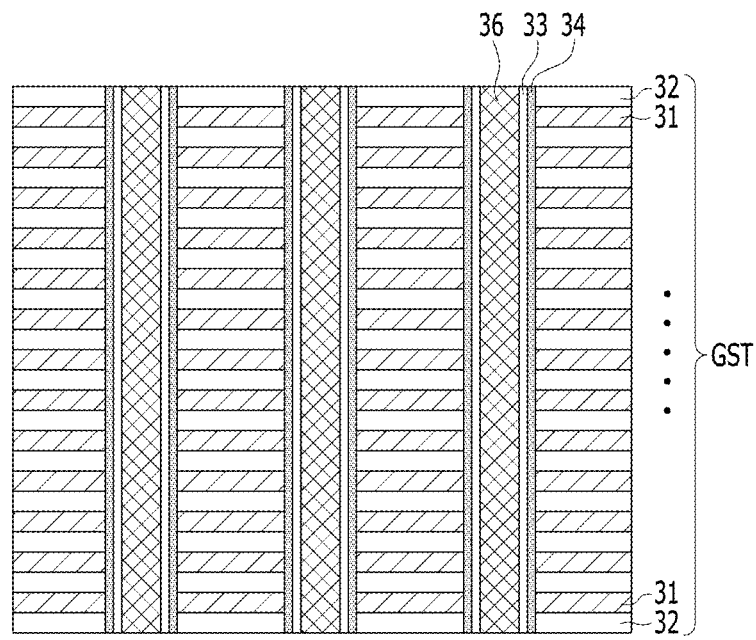
FIG. 3A and FIG. 3B are diagrams illustrating the structure of an example semiconductor device in accordance with an embodiment.
Figure 3B:
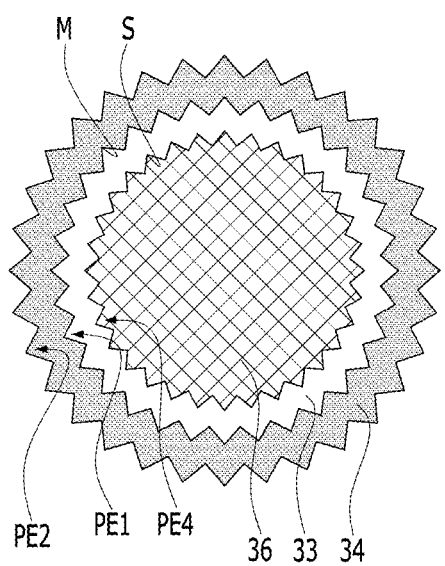

FIG. 3A and FIG. 3B are diagrams illustrating the structure of an example semiconductor device in accordance with an embodiment. Previously described content may not be repeated.

Referring to FIG. 3A and FIG. 3B, the semiconductor device may include a gate structure GST, a first channel layer 33, or a memory layer 34, or a combination thereof. The semiconductor device may further include a second channel layer 36. The gate structure GST may include conductive layers 31 and insulating layers 32 that are alternately stacked. A conductive layer 31 may be a gate line such as a word line, a bit line, or a select line.

The first channel layer 33 may be located in the gate structure GST and may extend in the third direction III. The first channel layer 33 may include a topological insulator. The first channel layer 33 may include at least one first protruding edge PE1 on its outer sidewall. The first protruding edge PE1 may have a shape in which the mirror symmetry of a topological insulator is maintained. The first channel layer 33 may include a semiconductor region and a non-conductor region. The semiconductor region may be located in the first protruding edge PE1 and may be used as a channel region of a transistor.

The second channel layer 36 may be located in the first channel layer 33. In an embodiment, the first channel layer 33 may have a tube shape, and the second channel layer 36 may fill the inside of the first channel layer 33. The second channel layer 36 may extend in the third direction III in the gate structure GST. In an embodiment, the first channel layer 33 and the second channel layer 36 may be coaxial. The second channel layer 36 may include a material different from that of the first channel layer 33. In an embodiment, the first channel layer 33 may include a topological insulator and the second channel layer 36 may include polysilicon.

The second channel layer 36 may include at least one fourth protruding edge PE4 on its outer sidewall. The fourth protruding edge PE4 may be located corresponding to the first protruding edge PE1 or a second protruding edge PE2 on the outer sidewall. The inner sidewall of the first channel layer 33 may contact the fourth protruding edge PE4 and may have the similar shape to the fourth protruding edge PE4. The fourth protruding edge PE4 may have a shape corresponding to the first protruding edge PE1 and/or the second protruding edge PE2. For reference, although not illustrated in the drawings, the semiconductor device may further include an insulating core located in the second channel layer 36.

The memory layer 34 may be located between the first channel layer 33 and the conductive layers 31. The memory layer 34 may include at least one of a blocking layer, a data storage layer, or a tunneling layer, or a combination thereof. The memory layer 34 may include at least one second protruding edge PE2 on the outer sidewall and/or the inner sidewall thereof. The second protruding edge PE2 may be located corresponding to the first protruding edge PE1 and/or the fourth protruding edge PE4, and may have a shape corresponding to the first protruding edge PE1 and/or the fourth protruding edge PE4.

According to the structure described above, a transistor including the first channel layer 33 and the second channel layer 36 may be implemented. The second channel layer 36 may provide a channel region of a transistor together with the first channel layer 33. In an embodiment, during an operation of the transistor, a main channel M may be formed in the first protruding edge PE1 of the first channel layer 33 and a sub-channel S may be formed in the second channel layer 36. Accordingly, when the flow of current provided by the first channel layer 33 including a topological insulator is insufficient, the current flow of the transistor may be compensated through the second channel layer 36 including a polysilicon layer.

Figure 4A:
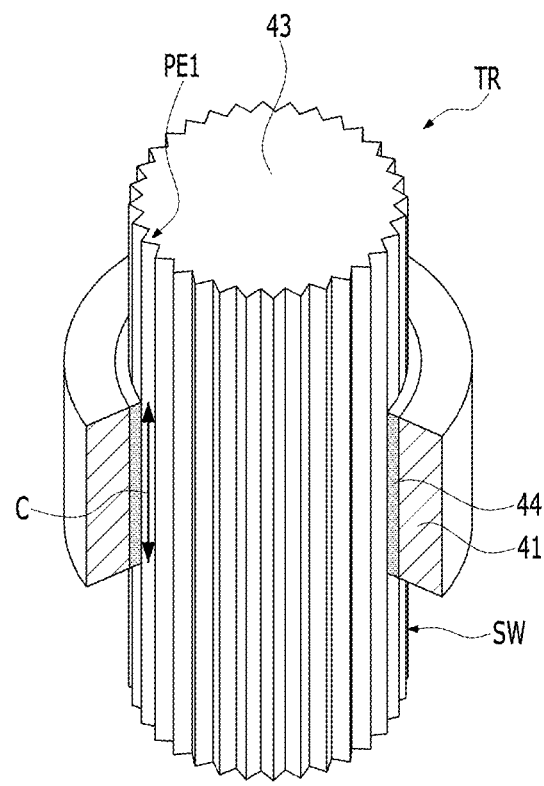
FIG. 4A to FIG. 4C are diagrams for describing the structure and operation characteristics of an example transistor in accordance with an embodiment.
Figure 4B:
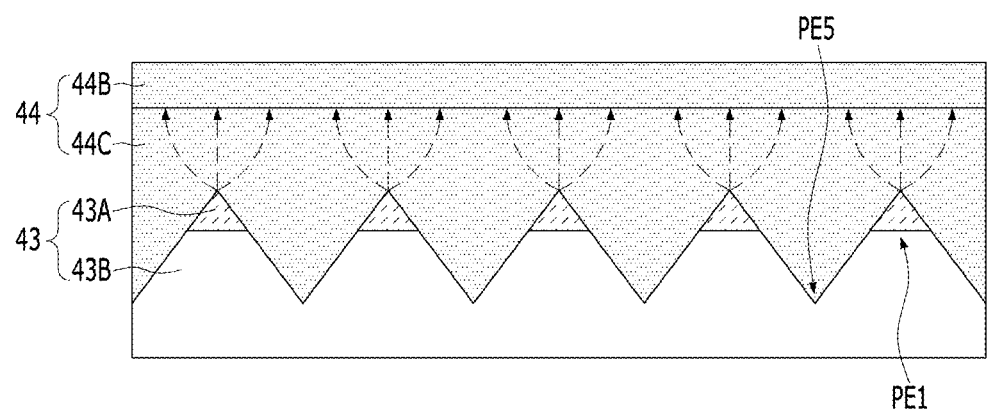
Figure 4C:
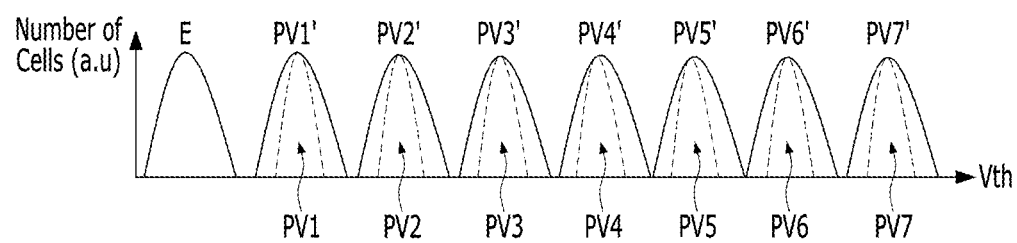

FIG. 4A to FIG. 4C are diagrams for describing the structure and operation characteristics of an example transistor in accordance with an embodiment. Previously described content may not be repeated.

Referring to FIG. 4A, a transistor TR may include a channel layer 43, a memory layer 44, and a gate electrode 41. The transistor TR may further include a second channel layer or an insulating core in the channel layer 43, or a combination thereof.

The channel layer 43 may include a topological insulator. When the transistor TR uses the topological insulator as the channel layer 43, a current flow is concentrated on the sidewall of the channel layer 43, so that cell current may be improved. When the transistor TR is turned on, current C may flow through a semiconductor region located in the first protruding edge PE1 of the channel layer 43. Since the current flow is concentrated on the first protruding edge PE1, the cell current may be improved. In an embodiment, the channel layer 43 may include one first protruding edge PE1, and current may flow through the one first protruding edge PE1. A sidewall SW excluding the first protruding edge PE1 may be a non-conductor region and no current may flow there. Alternatively, the channel layer 43 may include a plurality of first protruding edges PE1. It may be possible to improve a current flow through a multi-channel structure in which one memory cell includes a plurality of current paths.

The gate electrode 41 may surround the entire surface of the sidewall SW of the channel layer 43. Accordingly, by applying an electric field to the entire surface of the channel layer 43, the cell current may be improved. The gate electrode 41 may be electrically connected to a gate line such as a select line, a word line, or a bit line, or may be a part of the gate line. The memory layer 44 may be located between the channel layer 43 and the gate electrode 41.

Referring to FIG. 4B, the channel layer 43 and a tunneling layer 44C of the memory layer 44 may face each other. In an embodiment, the first protruding edge PE1 may protrude into the tunneling layer 44C as shown. The tunneling layer 44C may fill portions between adjacent first protruding edges PE1. In an embodiment, the tunneling layer 44C may include fifth protruding edges PE5 protruding between the first protruding edges PE1 as shown.

A semiconductor region 43A may be formed entirely in the first protruding edge PE1, or may be formed in a part of the first protruding edge PE1. In an embodiment, the semiconductor region 43A may be formed only near the tip of the first protruding edge PE1, and the first protruding edge PE1 may include the semiconductor region 43A and the non-conductor region 43B. When the semiconductor region 43A is formed at the tip of the first protruding edge PE1, an electric field may be concentrated through the tip of the first protruding edge PE1 during an operation of a transistor and dispersed through the tunneling layer 44C, so that the electric field may be uniformly applied to the data storage layer 44B.

FIG. 4C illustrates a cell distribution of memory cells. FIG. 4C shows program levels of PV1' to PV7' and program levels of PV1 to PV7. The X-axis may represent the level of a threshold voltage Vth and the Y-axis may represent the number of memory cells. Memory cells in an erase state may have a distribution E, and memory cells in a program state may have one of k distributions. In an embodiment, when the channel layer 43 includes a polysilicon layer, the memory cells may be programmed at one of program levels PV1' to PVk'. When the channel layer 43 includes a topological insulator, the memory cells may be programmed at one of program levels PV1 to PVk having a narrower width than PV1' to PVk'. In the above, k may be an integer equal to or greater than 2.

According to the structure described above, since the gate electrode 41 surrounds the entire surface of the channel layer 43 and the channel layer 43 includes a topological insulator, the operating characteristics of the transistor TR may be improved. By improving the threshold voltage distribution of memory cells, a read window margin may be secured.

Figure 5A:
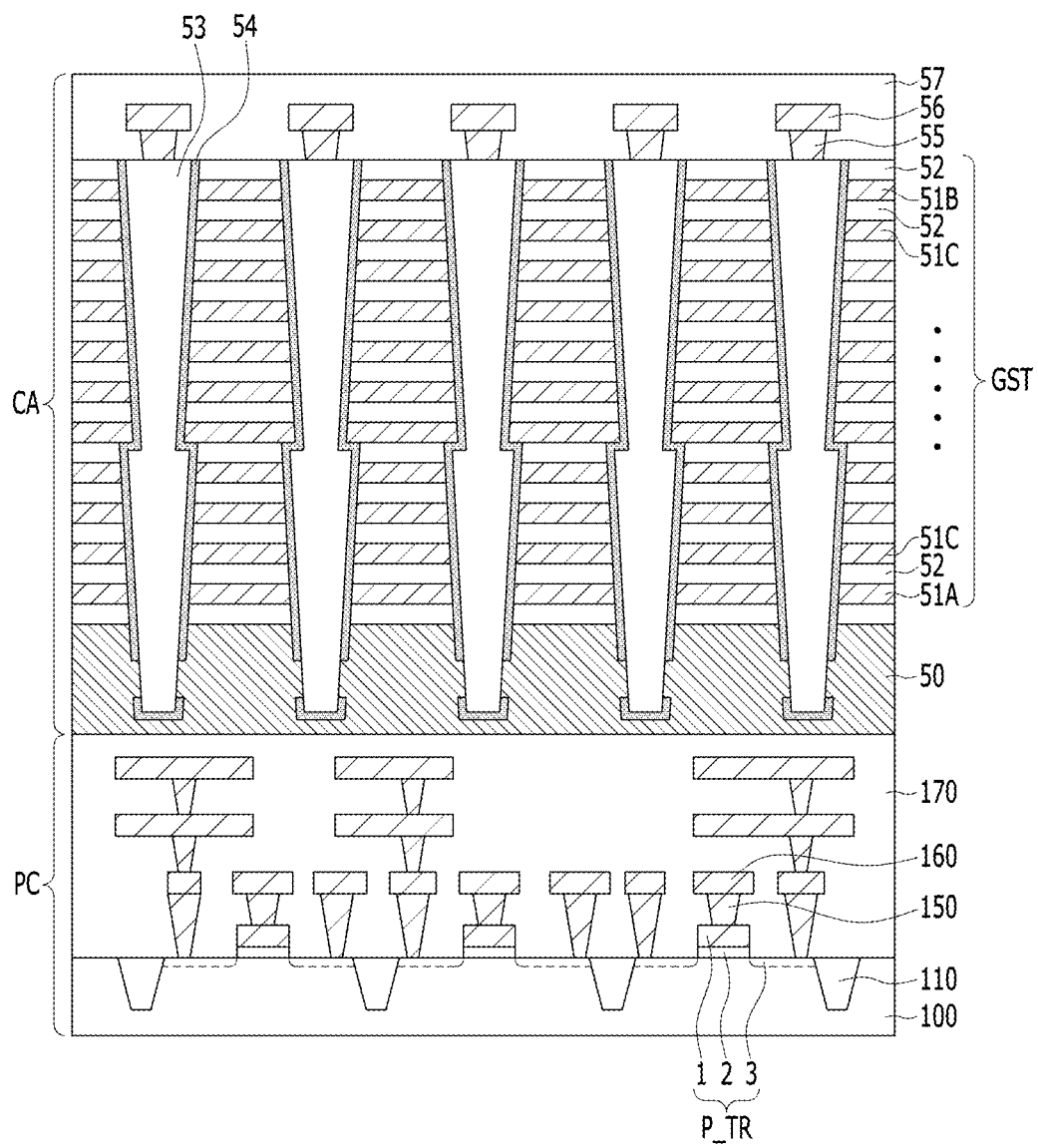
FIG. 5A and FIG. 5B are diagrams for describing the structure and cell array of an example semiconductor device in accordance with an embodiment.
Figure 5B:
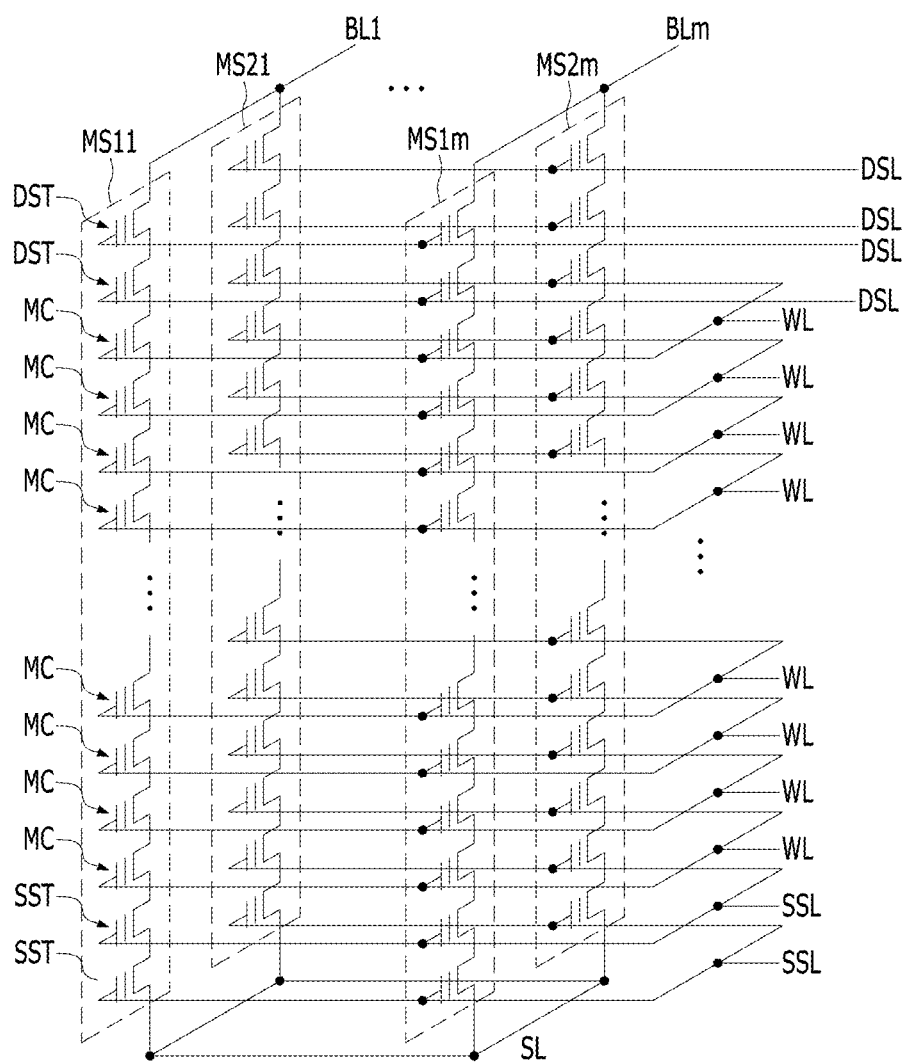

FIG. 5A and FIG. 5B are diagrams for describing the structure and cell array of an example semiconductor device in accordance with an embodiment. FIG. 5A may be a cross-sectional view of a semiconductor device, and FIG. 5B may be a circuit diagram of a cell array. Previously described content may not be repeated.

Referring to FIG. 5A, the semiconductor device may include a cell array CA. The semiconductor device may include a source line 50, a gate structure GST, a channel layer 53, or a memory layer 54, or a combination thereof. The semiconductor device may further include a second contact plug 55, a bit line 56, or a second interlayer dielectric layer 57, or a combination thereof.

The gate structure GST may be located between the source line 50 and the bit line 56. The gate structure GST may include conductive layers 51A to 51C and insulating layers 52 that are alternately stacked. The conductive layers 51A to 51C may include at least one source select line 51A, at least one drain select line 51B, and a plurality of word lines 51C. The source select line 51A may be located between the source line 50 and the word lines 51C, and the drain select line 51B may be located between the bit line 56 and the word lines 51C. The second interlayer dielectric layer 57 may be located on the gate structure GST, and the bit line 56, and the second contact plug 55 may be located in the second interlayer dielectric layer 57.

The channel layer 53 may be connected between the bit line 56 and the source line 50. The channel layer 53 may be connected to the bit line 56 through the second contact plug 55. The channel layer 53 may be directly connected to the source line 50 or may be connected to the source line 50 through an epitaxially grown semiconductor layer. The channel layer 53 may extend from the bit line 56 to the source line 50 through the gate structure GST.

As described above, the channel layer 53 may include at least one protruding edge on its outer sidewall. The channel layer 53 may include a semiconductor region located in the protruding edge and a non-conductor region located in the semiconductor region. The channel layer 53 may include a topological insulator, and the topological insulator may have mirror symmetry at the protruding edge. The semiconductor device may further include a second channel layer and/or an insulating core located in the topological insulator. In an embodiment, the channel layer 53 may include a topological insulator, and the second channel layer may include polysilicon. The memory layer 54 may be located between the channel layer 53 and the conductive layers 51. In an embodiment, the memory layer 54 may surround the sidewall of the channel layer 53.

A source select transistor may be located at an intersection region of the channel layer 53 and the source select line 51A. The source select transistor may include the channel layer 53 including the topological insulator and the memory layer 54. A drain select transistor may be located at an intersection region of the channel layer 53 and the drain select line 51B. The drain select transistor may include the channel layer 53 including the topological insulator and the memory layer 54. Memory cells may be located at an intersection region of the channel layer 53 and the word line 51C. The memory cell may include the channel layer 53 including the topological insulator and the memory layer 54. The source select transistor, the memory cells, and the drain select transistor sharing one channel layer 53 may constitute one memory string. The source select transistor or the drain select transistor may use the memory layer 54 as a gate insulating layer.

The semiconductor device may further include a peripheral circuit PC. The peripheral circuit PC may include a substrate 100, a transistor P_TR, an isolation layer 110, a first contact plug 150, a wiring line 160, or a first interlayer dielectric layer 170, or a combination thereof. The transistor P_TR may include a gate electrode 1, a gate insulating layer 2, and a junction 3. The peripheral circuit PC may be located at the same level as a cell array CA, or may be located above or below the cell array CA. The cell array CA and the peripheral circuit PC may be formed as a single chip. Alternatively, after a cell chip including the cell array CA and a peripheral circuit chip including the peripheral circuit PC are respectively formed, the cell chip and the peripheral circuit chip may be bonded to each other.

Referring to FIG. 5B, memory strings MS11 to MS2*m* may be connected between a source line SL and bit lines BL1 to BLm. Each of the memory strings MS11 to MS2*m* may include at least one source select transistor SST, a plurality of memory cells MC, and at least one drain select transistor DST connected in series. In the above, m may be an integer of equal to or greater than 2. Gate electrodes of the memory cells MC may be connected to word lines WL. Word line voltages (program voltage, pass voltage, read voltage, and the like) necessary for driving may be applied to each of the word lines WL. Gate electrodes of the drain select transistors DST may be connected to a drain select line DSL. Gate electrodes of the source select transistors SST may be connected to a source select line SSL.

According to the structure described above, the source select transistor(s) SST, the plurality of memory cells MC, and the drain select transistor(s) DST included in each of the memory string MS11 to MS2*m* may share the channel layer 53 (FIG. 5A) including a topological insulator. During a program, read, or erase operation, a current path may be formed or removed from the first protruding edge formed on the sidewall of the channel layer 53. Accordingly, a current flow may be improved and the operating characteristics of the semiconductor device may be improved.

Figure 6A:
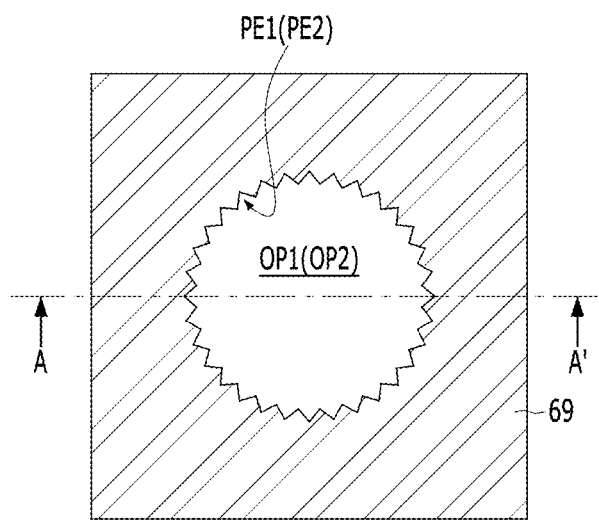
FIG. 6A, FIG. 6B, FIG. 7A, FIG. 7B, FIG. 8A, and FIG. 8B are diagrams for describing an example manufacturing method of a semiconductor device in accordance with an embodiment.
Figure 6B:
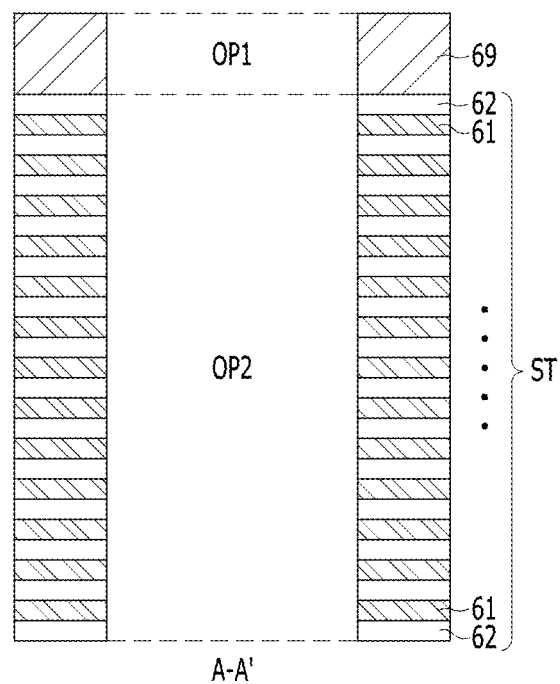
Figure 7A:
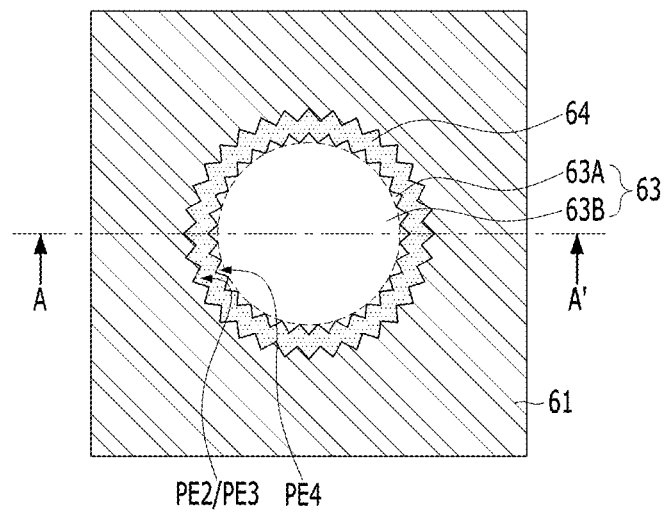
Figure 7B:
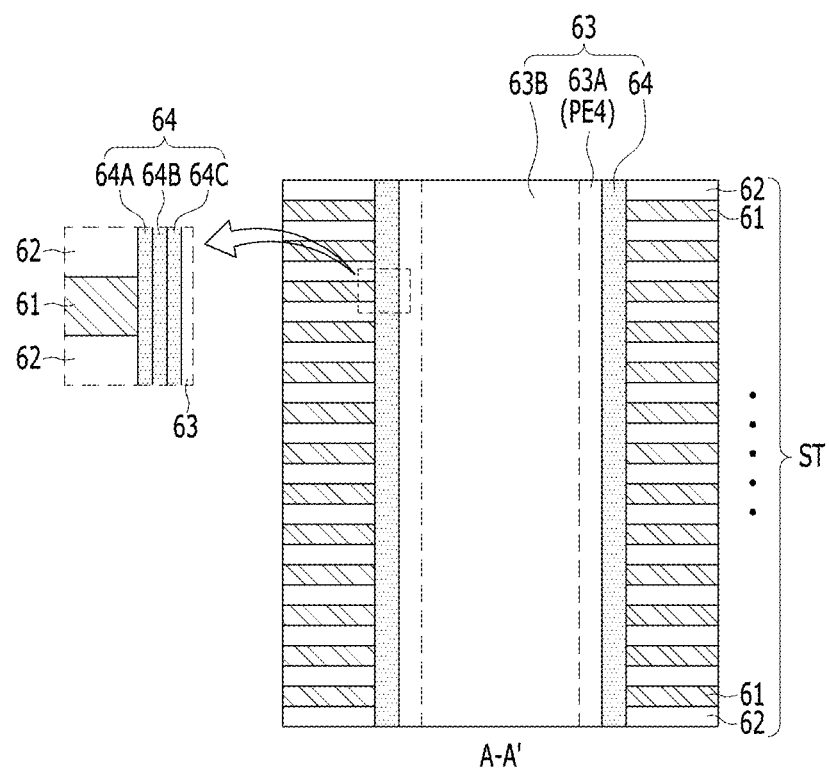
Figure 8A:
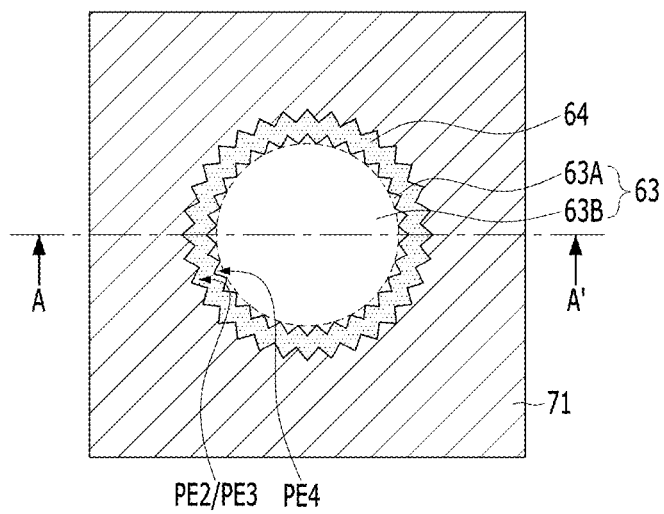

FIG. 6A, FIG. 6B, FIG. 7A, FIG. 7B, FIG. 8A, and FIG. 8B are diagrams for describing an example manufacturing method of a semiconductor device in accordance with an embodiment. FIG. 6A, FIG. 7A, and FIG. 8A may be plan views, and FIG. 6B, FIG. 7B, and FIG. 8B may be cross-sectional views taken along lines A-A' in FIG. 6A, FIG. 7A, and FIG. 8A, respectively. Previously described content may not be repeated.

Referring to FIG. 6A and FIG. 6B, a stack ST may be formed. In an embodiment, the stack ST may be formed on a substrate (not shown) that may include a lower structure such as, for example, a source line. The stack ST may include first material layers 61 and second material layers 62 that are alternately stacked. The first material layers 61 may be used to form a word line, a bit line, a select line, and the like, and the second material layers 62 may be used to form an insulating layer. The first material layers 61 may each include a material having a high etch selectivity with respect to the second material layers 62. For example, the first material layers 61 may each include a sacrificial material such as, for example, nitride, and the second material layers 62 may include an insulating material such as, for example, oxide. In another example, the first material layers 61 may each include a conductive material such as, for example, polysilicon, tungsten, molybdenum, etc., and the second material layers 62 may each include an insulating material such as, for example, oxide.

Subsequently, a mask pattern 69 may be formed on the stack ST. The mask pattern 69 may include at least one first opening OP1, and the first opening OP1 may include at least one first protruding edge PE1. In an embodiment, a second opening OP2 may be formed by etching the stack ST using the mask pattern 69 as an etch barrier. The second opening OP2 may be formed at a position corresponding to the first opening OP1 and may extend to the lower structure such as the source line. The second opening OP2 may include at least one second protruding edge PE2. As shown in FIG. 6A, the second protruding edge PE2 may be transferred from the first protruding edge PE1. That is, the second protruding edge PE2 may be similarly located and shaped as the first protruding edge PE1.

Referring to FIG. 7A and FIG. 7B, a memory layer 64 may be formed in the second opening OP2. The memory layer 64 may be formed along an inner surface of the second opening OP2 similarly as described with respect to the memory layer 14 in FIGS. 1A and 1B. The memory layer 64 may include at least one third protruding edge PE3 on its outer sidewall. The third protruding edge PE3 may be transferred from the second protruding edge PE2 of the second opening OP2. The memory layer 64 may further include a protruding edge on its inner sidewall. The memory layer 64 may include, for example, a blocking layer 64A, a data storage layer 64B, and a tunneling layer 64C.

In an embodiment, the blocking layer 64A including the third protruding edge PE3 transferred from the second protruding edge PE2 may be formed in the second opening OP2. Subsequently, the data storage layer 64B including a protruding edge transferred from the blocking layer 64A may be formed in the blocking layer 64A. Then, the tunneling layer 64C including a protruding edge transferred from the data storage layer 64B may be formed in the data storage layer 64B.

A channel layer 63 may then be formed along the inner sidewall of the memory layer 64. This may be also referred to as forming the channel layer 63 on the memory layer 64. The channel layer 63 may include at least one fourth protruding edge PE4. The channel layer 63 may include a topological insulator. The channel layer 63 may be formed by filling the memory layer 64 with the topological insulator. The topological insulator may have mirror symmetry at the fourth protruding edge PE4. The topological insulator may include a topological crystalline insulator or a higher order topological insulator. In an embodiment, the channel layer 63 may include, for example, $Bi_2Se_3$, $Bi_2Te_3$, $Sb_2Te_3$, $SnTe$, $Bi_2Se_2Te$, $Bi_2Te_2$, $Bi_{2-x}Sb_xTe_3$, $Bi_xSb_{1-x}Te_ySe_{1-y}$, etc., or a combination thereof. The channel layer 63 may include a two-dimensional material. In an embodiment, the channel layer 63 may be formed by depositing, for example, a two-dimensional atomic layer along the inner surface of the second opening OP2 by using a deposition method such as, for example, atomic layer deposition (ALD), chemical vapor deposition (CVD), etc. The channel layer 63 may include a semiconductor region 63A located in the fourth protruding edge PE4 and a non-conductor region 63B located in the semiconductor region 63A.

Figure 8B:
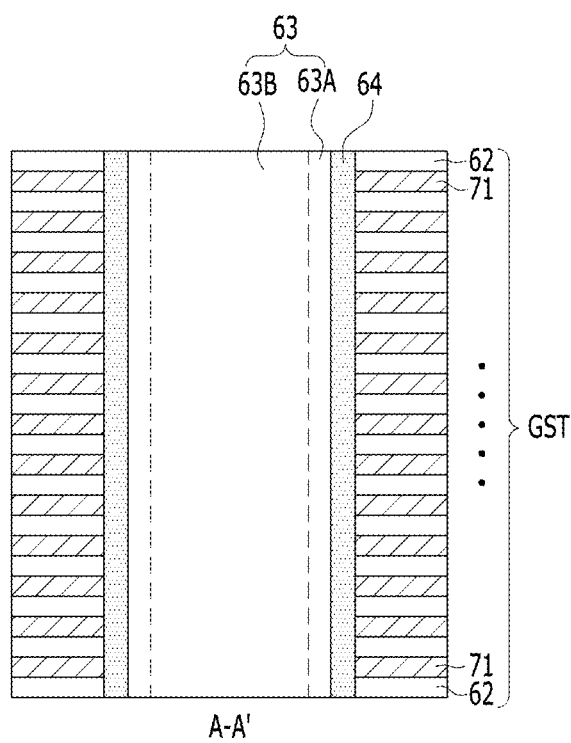

Referring to FIG. 8A and FIG. 8B, the first material layers 61 may be replaced with third material layers 71. For example, when the first material layers 61 each include a sacrificial material, the first material layers 61 may each be replaced with a conductive material. In another example, when the first material layers 61 each include a conductive material, the first material layers 61 may be silicified to form the third material layers 71. For reference, the process of replacing the third material layer 71 may be omitted, and the first material layers 61 may be used as a gate line as is.

Therefore, a gate structure GST including the third material layers 71 and the second material layers 62 that are alternately stacked may be formed. The gate structure GST may include transistors stacked along the channel layer 63.

According to the manufacturing method described above, the channel layer 63 including the fourth protruding edge PE4 may be formed. Furthermore, number, shapes, and the like of the fourth protruding edges PE4 included in the channel layer 63 may be adjusted using a mask pattern 69. The fourth protruding edges PE4 may be symmetrically arranged or asymmetrically arranged on the sidewall of the channel layer 63. Each of the fourth protruding edges PE4 may have a symmetrical shape or an asymmetrical shape. Accordingly, by adjusting the material of the channel layer 63 and the number, shapes, and the like of the fourth protruding edges PE4, the characteristics of a transistor may be adjusted.

Figure 9A:
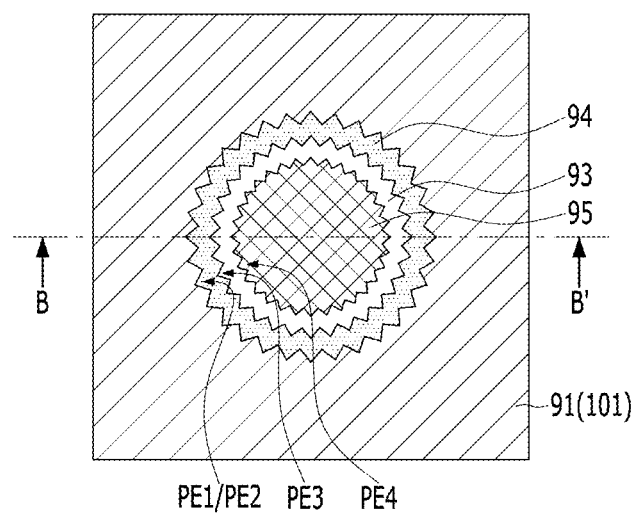
FIG. 9A and FIG. 9B are diagrams for describing an example manufacturing method of a semiconductor device in accordance with an embodiment.
Figure 9B:
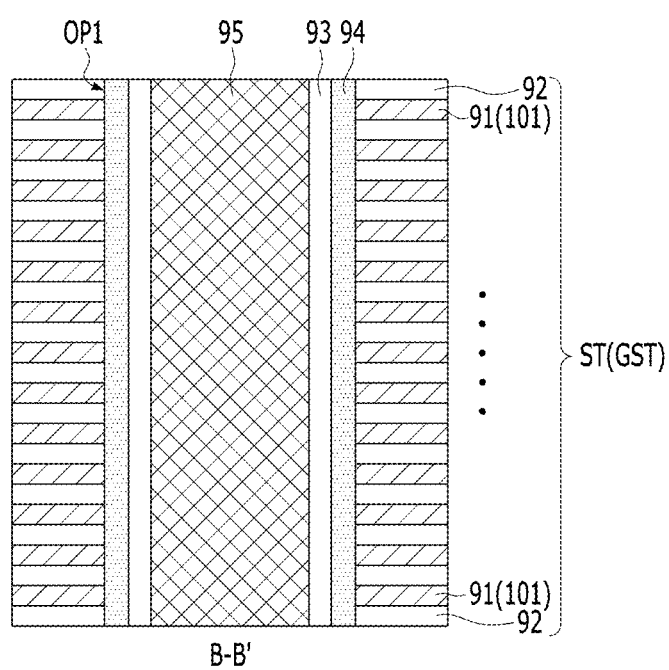

FIG. 9A and FIG. 9B are diagrams for describing an example manufacturing method of a semiconductor device in accordance with an embodiment. FIG. 9A may be a plan view, and FIG. 9B may be a cross-sectional view taken along line B-B' in FIG. 9A. Previously described content may not be repeated.

Referring to FIG. 9A and FIG. 9B, a stack ST including first material layers 91 and second material layers 92 that are alternately stacked may be formed. The first material layers 91 may be sacrificial layers or conductive layers, and the second material layers 92 may be insulating layers. Subsequently, a first opening OP1 including at least one first protruding edge PE1 may be formed in the stack ST.

Then, a memory layer 94 including at least one second protruding edge PE2 transferred from the at least one first protruding edge PE1 may be formed in the first opening OP1. Subsequently, a first channel layer 93 including at least one third protruding edge PE3 transferred from the at least one second protruding edge PE2 may be formed on the inner sidewall of the memory layer 94. The first channel layer 93 may include a topological insulator, and the topological insulator may have mirror symmetry at the third protruding edge PE3. Accordingly, the first channel layer 93 may include a semiconductor region located at the third protruding edge PE3 and a non-conductor region located in the semiconductor region.

Subsequently, a second channel layer 95 may be formed on the inner sidewall of the first channel layer 93. The second channel layer 95 may include, for example, a material different from that of the first channel layer 93, and include, for example, polysilicon. The second channel layer 95 may include at least one fourth protruding edge PE4 transferred from the at least one third protruding edge PE3. In an embodiment, the second channel layer 95 may fill the remaining portion of the first opening OP1 so as to be surrounded by the first channel layer 93. Alternatively, in some embodiments, the second channel layer 95 may be a tubular shape and an insulating core may be formed in the axial empty space of the second channel layer 95. In still other embodiments, an insulating core may fill the remaining portion of the first opening OP1 so as to be surrounded by the first channel layer 93.

Subsequently, the first material layers 91 may be replaced with third material layers 101. The third material layers 101 may be conductive layers. Therefore, a gate structure GST including the third material layers 101 and the second material layers 92 that are alternately stacked may be formed.

According to the above-described manufacturing method, by additionally forming the second channel layer 95 and/or the insulating core surrounded by the first channel layer 93, the current flow of a transistor may be improved.

Although embodiments according to the present disclosure have been described above with reference to the accompanying drawings, this is only for explaining the embodiments according to the concept of the present disclosure, and the present disclosure is not limited to the above embodiments. Various substitutions, modifications, and/or changes for the embodiments may be made by those skilled in the art without departing from the scope of the present disclosure. It should be construed that these substitutions, modifications, and changes belong to the scope of the present disclosure and may be claimed.

What is claimed is:

1. A semiconductor device comprising:
   a source line;
   a bit line;
   a gate structure, located between the source line and the bit line, including conductive layers and insulating layers that are alternately stacked;
   a topological insulator, extending from the bit line to the source line through the gate structure, including:
   a non-conductor region; and
   semiconductor regions coupled to the non-conductor region and located at a sidewall of the topological insulator; and
   a memory layer surrounding the topological insulator.

2. The semiconductor device of claim 1, wherein the topological insulator comprises at least one first protruding edge on the sidewall thereof, and the semiconductor region is located at the first protruding edge.

3. The semiconductor device of claim 2, wherein the topological insulator has mirror symmetry at the first protruding edge and current flows through the first protruding edge.

4. The semiconductor device of claim 2, wherein the at least one first protruding edge has a polygonal shape in plan view.

5. The semiconductor device of claim 1, wherein the non-conductor region isolates the semiconductor regions from each other.

6. The semiconductor device of claim 1, further comprising:
   an insulating core located in the topological insulator.

7. The semiconductor device of claim 1, wherein the topological insulator has a sawtooth shape in plan view.

8. A semiconductor device, comprising:
   a source line;
   a bit line;
   a gate structure, located between the source line and the bit line, including conductive layers and insulating layers that are alternately stacked;
   a topological insulator, extending from the bit line to the source line through the gate structure, including:
   a non-conductor region; and
   semiconductor regions coupled to the non-conductor region and located at a sidewall of the topological insulator;
   a memory layer surrounding the topological insulator; and
   a sub-channel layer located in the non-conductor region of the topological insulator.

9. The semiconductor device of claim 8, wherein the sub-channel layer includes polysilicon.

10. The semiconductor device of claim 1, wherein the memory layer comprises:
    a tunneling layer surrounding the topological insulator;
    a data storage layer surrounding the tunneling layer; and
    a blocking layer surrounding the data storage layer.

11. The semiconductor device of claim 1, wherein an outer sidewall of the memory layer includes at least one second protruding edge.

12. The semiconductor device of claim 1, wherein an inner sidewall of the memory layer includes at least one third protruding edge.

13. The semiconductor device of claim 1, wherein the topological insulator includes a two-dimensional atomic layer.

14. The semiconductor device of claim 1, wherein the topological insulator includes $Bi_2Se_3$, $Bi_2Te_3$, $Sb_2Te_3$, SnTe, $Bi_2Se_2Te$, $Bi_2Te_2Se$, $Bi_{2-x}Sb_xTe_3$, or $Bi_xSb_{1-x}Te_ySe_{1-y}$, or a combination thereof.

15. A semiconductor device comprising:
a bit line;
a source line; and
a memory string connected between the bit line and the source line and including:
 at least one source select transistor;
 at least one drain select transistor; and
 a plurality of memory cells coupled between the at least one source select transistor and the at least one drain select transistor,
wherein each of the memory cells comprises:
 a first channel layer including a topological insulator including first protruding edges, wherein the topological insulator includes semiconductor regions located at the first protruding edges;
 a tunneling layer surrounding the first channel layer;
 a data storage layer surrounding the tunneling layer; and
 a blocking layer surrounding the data storage layer.

16. The semiconductor device of claim 15, wherein, when the memory cells are turned on, current flows through the semiconductor regions of the first protruding edges.

17. The semiconductor device of claim 15, wherein, when the at least one source select transistor or the at least one drain select transistor is turned on, current flows through the semiconductor regions of the first protruding edges.

18. The semiconductor device of claim 15, wherein the topological insulator comprises:
a non-conductor region; and
the semiconductor regions coupled to the non-conductor region and having mirror symmetry.

19. The semiconductor device of claim 15, wherein the first protruding edges protrude into the tunneling layer.

20. The semiconductor device of claim 15, wherein the topological insulator has a sawtooth shape in plan view.

* * * * *